United States Patent [19]

Cedrone

[11] Patent Number: 4,509,010

[45] Date of Patent: Apr. 2, 1985

[54] LEAD COMBING APPARATUS FOR RADIAL LEAD ELECTRONIC DEVICES

[76] Inventor: Nicholas J. Cedrone, 10 Hawthorne Rd., Wellesley Hills, Mass. 02181

[21] Appl. No.: 452,885

[22] Filed: Dec. 27, 1982

[51] Int. Cl.[3] .......... G01R 31/00

[52] U.S. Cl. .......... 324/158 P; 339/108 TP

[58] Field of Search .......... 324/158 P, 158 F, 158 T, 324/158 D, 73 AT, 72 G; 339/108 TP; 29/574, 577 R

[56] References Cited

U.S. PATENT DOCUMENTS 3,596,180 7/1981 Schmitt .......... 324/158 T
4,429,275 1/1984 Cedrone .......... 324/73 AT

*Primary Examiner*—Stewart J. Levy
*Attorney, Agent, or Firm*—Kenway & Jenney

[57] ABSTRACT

Automatic combing and separation of the leads of radial lead electronic devices is provided by at least one flexible, insulating blade mounted on a contactor assembly whose contacts are lowered onto and then drawn along the leads. The blade is positioned to interpose itself between adjacent leads. A center contact has a window that mounts locating pin. The blade extends through the window and is preferably urged resiliently into contact with the pin to provide an accurate and reliable alignment between the blade tip and an opening between a center lead and an adjacent lead.

4 Claims, 6 Drawing Figures

LEAD COMBING APPARATUS FOR RADIAL LEAD ELECTRONIC DEVICES

BACKGROUND OF THE INVENTION

This invention relates in general to apparatus for high speed, automated testing and handling of electronic devices. More specifically, it relates to a system for combing and electrically isolating from one another the leads of a radial lead device just prior to and during testing.

Radial lead devices are characterized by a body and a set of leads, typically three, that extend from one side of the body in generally the same direction. While the leads are ideally parallel, some small, but significant portion of the devices will have leads that are bent so that the leads are in electrical connection with one another. When such a device is tested, it will appear to be defective, whereas in fact it is often not defective. This problem is particularly severe in the most common type of radial lead devices, namely, small signal transistors such as type TO-92. These transistors have three closely spaced, co-planar leads formed of a fine wire material that is readily bent. As a rough rule of thumb, present testing and sorting apparatus for these transistors will reject approximately 2%-5% of the transistors as defective when in fact they are not defective, but merely have leads bent into contact with one another. In present practice, these devices are rejected and discarded. Solution of the "bent lead" problem therefore offers a considerable economic advantage.

In order to test a radial lead device, a contactor assembly makes an electrical connection between a test circuit and each lead of the device via a set of contacts mounted on the assembly. A typical such contactor assembly has been manufactured and sold by the Daymarc Corp. of Waltham, Mass., under the trade designation "TO-92 contactor". Each contact is designed to make connection with one lead of the device. The connection is made with an end portion of the contact which is oriented at a right angle with respect to the body of the contact. In this prior art assembly, the two outermost contacts have an inclined or "cut away" edge that steers the leads into alignment with the contacts as the contacts are lowered onto the leads. While this steering action will properly locate leads that are not severely bent, it may drive somewhat bent leads that are previously separated into contact with one another. If the leads of a TO-92 device are already in contact, there is no known high speed, automated system that can separate the leads reliably and maintain that separation during testing.

A major difficulty in attempts to separate the leads mechanically, as by a combing action, is that the spacing between adjacent leads, particularly co-planar leads, is very close. A comb must therefore reliably penetrate a "window" between an adjacent pair of leads that, for small signal transistors, is typically 1 mm wide. Moreover, this window must be penetrated reliably and at a high speed since modern testing equipment such as Daymarc Corporation's Type 1735 radial lead tester/-sorter processes these devices at throughput rates of 7,200 devices per hour. Other problems are that a successful combing system should accommodate devices with a variety of lead shapes and cross sections and it should resist abrasion by the often rough edges of the leads. The Daymarc 1735 tester/sorter has combed type TO-18 devices using a special contactor assembly that takes advantage of the triangular array of the TO-18 leads, as viewed end on, but this contactor has not worked successfully on other devices such as the type TO-92 which have co-planar leads.

It is therefore a principal object of this invention to provide a system for combing and separating radial leads prior to and during testing.

A further object is to provide a combing and separation system that repeatedly precisely locates a combing blade in the spacing between the leads.

Another object is to provide such a combing and separation system that has an uncomplicated construction and can be used on known radial lead testers that lower onto and wipe along the leads.

A further object is to provide a combing and separation system that is both highly wear resistant and readily replaced.

Still another object is to provide a contactor assembly with the foregoing advantages that can be used interchangeably with prior art contactor assemblies of this general type.

SUMMARY OF THE INVENTION

The present invention provides a set of combing blades mounted on a radial lead contactor assembly which mechanically comb and electrically insulate the leads prior to and during testing. The assembly includes a set of contacts, including two outer contacts and at least one inner or "center" contact, that are lowered onto and drawn along the leads to establish a good electrical connection between the leads and a test circuit. The comb blades are secured to the assembly on a mounting bracket located, in the preferred form, generally above and behind the contacts. A tapered end of each blade extends through a window formed in the body of the center contact. An alignment member, preferably a pin, extends into the window and is fixed to the center contact to locate the pin accurately with respect to the contact and hence with respect to the associated center lead of a device being tested. The blades straddle the pin with one face of each blade in a close face-abutting relationship with the pin, so that they are thereby accurately located with respect to the corresponding center lead. The width of the pin and blades are such that each blade penetrates the opening between the center lead and an adjacent lead, usually an outer lead, with a high degree of reliability. The blades are preferably formed of a resilient sheet material that has a low coefficient of sliding friction. The blades are also preferably mounted so that their inherent resiliency flexes them against the pin in the aforementioned abutting relationship. The contactor assembly preferably includes an arrangement for replaceably mounting the blades on their mounting bracket such as suitable alignment slots and a clamping screw.

These and other features and objects of the present invention will become apparent to those skilled in the art from the following detailed description of the preferred embodiments which should be read in light of the accompanying drawings.

DETAILED DESCRIPTION OF THE PREFERRED EMBODIMENTS

Figure 1:
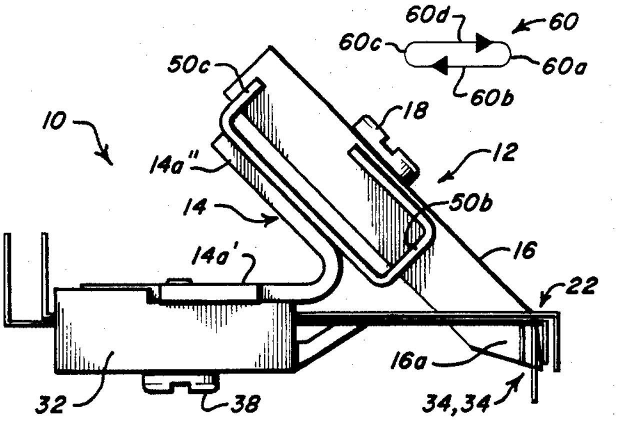
FIG. 1 is a view in side elevation of a contactor assembly for radial lead devices that incorporates a mechanical system according to the present invention for combing and separating the leads.
Figure 2:
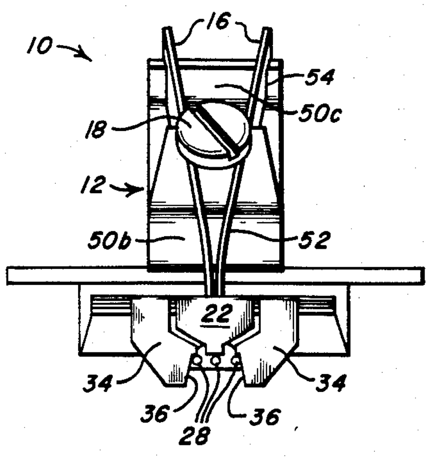
FIG. 2 is a view in front elevation of the contactor assembly shown in FIG. 1.
Figure 6:
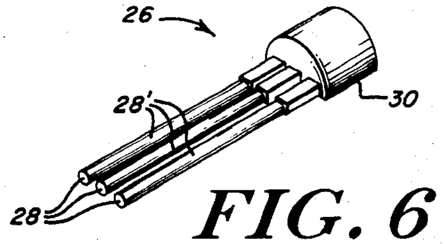
FIG. 6 is a perspective view of a common radial lead device, a small signal transistor with three co-planar leads.
Figure 3:
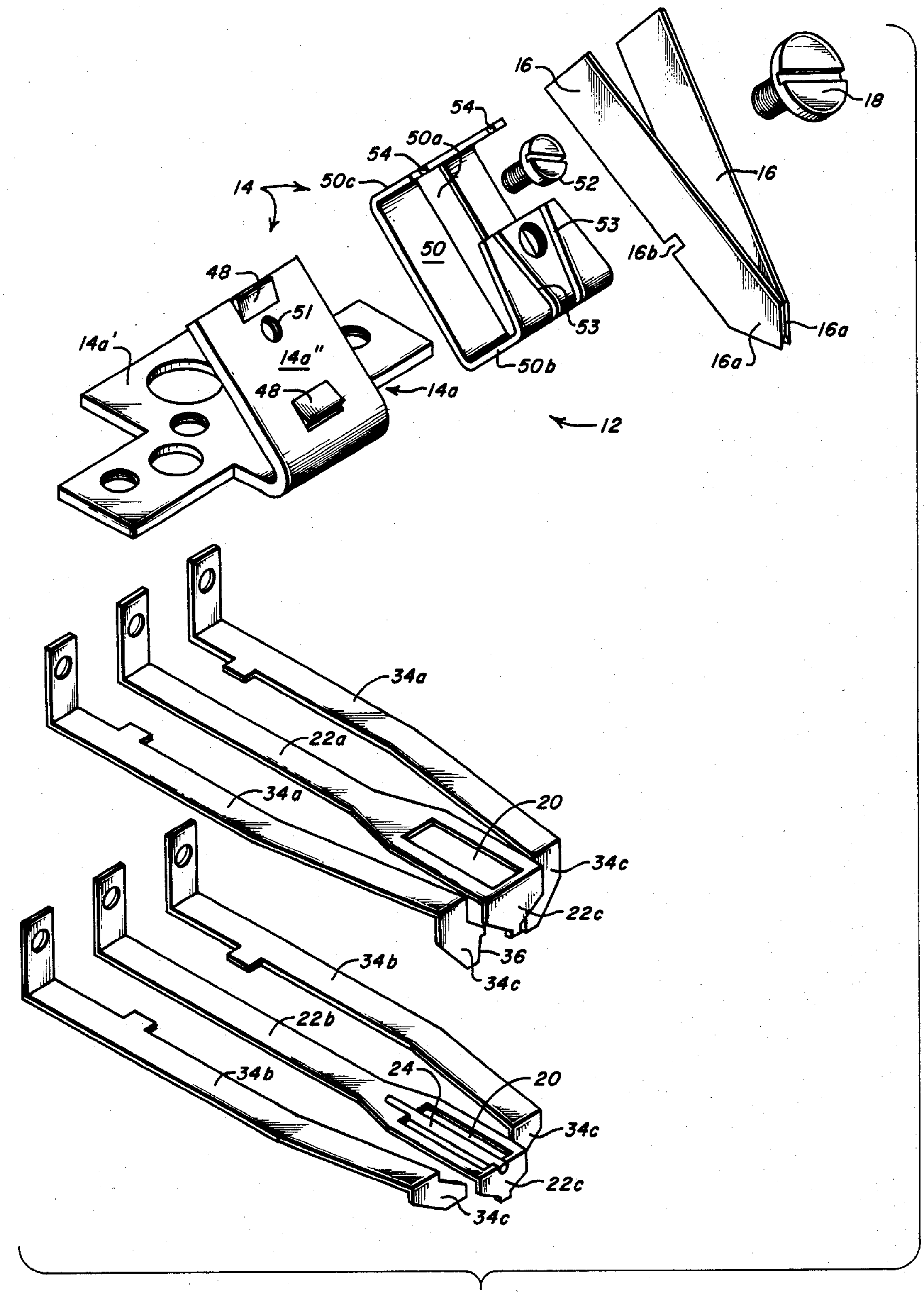
FIG. 3 is an exploded perspective view of the contacts and combing system of the contactor assembly shown in FIGS. 1 and 2.

FIGS. 1–3 show a contactor assembly 10 of the type manufactured and sold by the Daymarc Corporation of Waltham, Mass. for use with its Model 1735 tester/-sorter. This apparatus and this assembly are designed to test radial lead electronic devices such as a small signal transistor shown in FIG. 6. The contactor assembly 10, however, includes modifications according to the present invention which give this assembly the capability of combing radial leads prior to and during testing. The combing capability derives principally from a blade assembly 12, including a mounting bracket 14, a pair of combing blades 16,16, and a clamping screw 18, a window 20 formed in a center contact 22, and an alignment a locating pin 24 that is mounted on the center contact and extends into the window 20.

While this invention can be used to comb leads of devices having a wide variety of sizes, cross-sectional lead configurations, and geometrical arrangements of the leads with respect to one another, the invention will be described with reference to the assembly 10 which is particularly adapted for testing devices such as the small signal transistor 26, particularly type TO-92. These devices have three leads, a "center" lead 28 and two "outer" leads 28',28' that extend from the body 30 of the device 26 in the same general direction and are generally co-planar. Each lead is a fine metallic wire, usually of rectangular crosssection over most of its length, that is easily bent. A typical lead has about a 2:1 width to thickness ratio and an inter-lead spacing that is somewhat less than the width of one lead. If a lead width is 30 mils, the spacing may be about 20 mils. Normaly approximately 2% to 5% of such transistors have two or more leads that are bent into contact with one another so that they will test as a defective unit unless the leads are separated before the testing.

With further reference to FIGS. 1–3, the contactor assembly 10 has a body 32 and a set of contacts including the center contact 22 and a pair of "outer" contacts 34,34 each mounted at one end between said body halves. The contacts 22,34,34 are each preferably Kelvin contacts with a pair of contact elements forming each contact. As is best seen in FIG. 3, the contacts 22,34,34 are formed of "upper" contact elements 22*a*,34*a*,34*a* and associated lower contact elements 22*b*,34*b*,34*b*. Each contact has an angled-over end portion 22*c*,34*c*,34*c* located at its free end. These end portions are structured to steer a radial lead device such as the leads of the transistor 26 into a known alignment with the contacts and to make an electrical connection between each contact 22,34,34 and an associated lead 28,28',28', respectively. This relationship is shown in FIG. 2 where the transistor 26 is aligned with the contacts and they are in electrical connection with associated leads.

"Cut-away" or inclined cam surfaces 36,36 are formed on the lower side surface of the end protions 34*c*,34*c* of the outer, upper contacts 34*a*,34*a*. The cam surfaces 36,36 engage the outer leads 28',28' of the device and steer it into the proper alignment with the associated contacts 22,34,34 as the contactor assembly 10 is lowered onto the leads. Once fully lowered, the contact are accurately aligned with respect to the leads. The contactor assembly then moves along the leads drawing the contacts over the leads in a scraping action that helps to displace oxidation on the surface of the leads. This facilitates the electrical connection during the testing. When the testing is completed, the contacts lift from the leads and cycle back to a starting position where they again lower onto the leads of another devicee 26. This cycle of operation is depicted in FIG. 1 by the closed loop path of motion 60 executed for each device 26 by the assembly 10 and its contacts.

As is known in the art, the accuracy of the alignment between the leads and the contacts depends on the spacing and configuration of the cam surfaces 36,36 and the accuracy of the location of the leads with respect to the device body and one another. More generally, different lead sizes, numbers, inter-lead spacings and lead configurations will require a contactor assembly 10 tailored to that device and having the correct number, spacing and configuration of its contacts.

The comb mounting bracket 14 has a mounting bracket member 14*a* that is supported on the upper surface of the body 32. Screws 38 passing through the body 32 thread into holes in the base plate 14*a*' of the bracket 14*a* to secure it to the body of the contactor assembly. The bracket member 14*a* includes a portion 14*a*" that is angled backwardly from the front edge of the base plate 14*a*'. The portion 14*a*" has projections 48,48 that locate a comb mounting plate 50 that also forms part of the mounting bracket 14. The plate 50 has a central, longitudinally extending channel 50*a* that engages the projections 48,48 and thereby align the plate 50 with respect to the contacts. A screw 52 passes through the channel 50*a* and threads into a hole 51 in the portion 14*a*" to secure the plate 50.

A principal feature of this invention is the pair of combing blades 16,16. Each blade has a generally rectangular configuration and is formed from a sheet of a resilient insulating material. A preferred material also provides a low coefficient of sliding friction. Each blade 16 is mounted in a pair of slots 53,54 formed in the front and rear walls 50*b* and 50*c*, respectively, of the plate 50. The slots have a width such that the associated blade is securely held in a generally upright, "on-edge" orientation. The slots are offset from one another so that the blades 16,16 are mutually inclined with their lower ends 16*a*,16*a* adjacent the contact ends 22*c*,34*c*,34*c* converging towards one another. Each blades also contains a slot 16*b* formed in its lower edge that engages the front wall 50*b* of the plate so to position the blade longitudinally. The slot is located so that the end 16*a* of the blade extends a sufficient distance to interpose itself between adjacent leads 28, 28',28' when the contactor assembly is fully lowered onto the leads, and preferably somewhat before the fully lowered position is reached. A clamping screw 18 threads into the portion 14*a*" to secure the blades in their associated slots 53,54.

Another principal feature of this invention is an arrangement for precisely locating the blade tips 16*a*,16*a* with respect to the openings between the leads 28,28′,28′. More specifically, the window 20 (formed by overlying openings in both the upper and lower center contacts *22a,22b*) allows the blade tips 16*a*,16*a* access to the inter-lead openings; the locating pin 24 provides the necessary accuracy in locating the blade tips 16*a*,16*a*. The pin 24 preferably extends the length of the window 20 and is permanently secured at both ends to the lower center contact 22*b*. The pin 24 is aligned with the longitudinal axis of the contact 22*b*. Due to the lead-to-contact alignment provided by the steering edges 36,36, the pin 24 is therefore also aligned with the center lead 28. The pin 24 is preferably centered on an aligned center lead within close tolerances (±1.0 mm).

Figure 4:
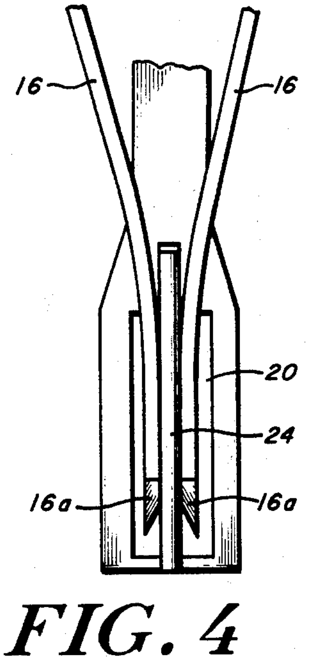
FIG. 4 is a detailed top plan view showing the arrangement for aligning the combing blades and the center contact.
Figure 5:
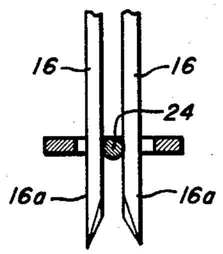
FIG. 5 is a view in vertical section taken along the line 5—5 in FIG. 4.

The blades are positioned by the slots 53,54 so that they each press against opposite sides of the pin 24 as is best seen in FIGS. 4 and 5. The blades can simply abut the pin 24, but preferably they are slightly flexed, as shown, to develop a spring force that ensures that the blades remain in the correct position even though they will ordinarily be subjected to forces during combing that drive them laterally. This spring force, together with the inherent strength of the blades and the limitation on their movement provided by the surrounding window 20, maintain the blades 16,16 in position to perform the combing even though the combing process itself can generate non-trivial lateral forces on the blades. As shown in FIG. 5, entry is also facilitated by forming the lowermost edges 16*a*′,16*a*′ of the blade tips 16*a*,16*a* with a chisel-like bevel. As shown in FIG. 1, the lower edges 16*a*′ are also preferably downwardly inclined as the tips 16*a* extend toward the ends of the contacts. This ensures that the blade tips will first enter the inter-lead openings at the point closest to the body of the transistor where the position of the leads is most accurately known. (The spacing of the leads near the body is fixed and better known because the leads are secured to the body. As the leads extend from the body, they are more likely to be bent and therefore deviate from a known location.)

The present invention functions as follows. After the body of the electrical device has moved into a testing station, the assembly 10 descends toward contact the leads (portion 60*a* of the closed loop path of motion shown in FIG. 1). The center contact 22 aligns with the center lead of the device as the cam surfaces 36, 36 steer the device to a known spatial relationship with respect to the contacts. As the assembly descends, the tips 16*a*, 16*a* of blades enter the openings between the leads. As the assembly then moves along the leads away from the body of the device ("testing" path portion 60*b* of FIG. 1), the blades 16, 16 comb and separate the leads. Once the assembly has traveled a sufficient distance to separate any bent leads that may have been in contact with each other, then testing is accomplished by means of a testing signal carried through the contacts 22, 34, 34. After testing is complete, the assembly moves in an upward direction away from the leads (path portion 60*c*) and returns to the starting point of the cycle of operation to comb and test another device (path portion 60*d*).

While the invention has been described with reference to its preferred embodiments, it will be understood that the modifications and variations will occur to those skilled in the art. For example, the present invention can be adapted to use with electrical devices with leads that are not co-planar. Such modifications and variations are intended to fall within the scope of the appended claims.

I claim:

1. In a contactor assembly for making an electrical connection to a radial lead electronic device having a body and at least a center and two outer leads projecting from said body in the same general direction, said contactor assembly having a body, at least a center and two outer contacts secured to said body and extending from said body in generally the same direction and terminating in end portions structured to make electrical connection with said radial leads, said outer contacts having means for steering said outer leads into a known alignment with respect to said contacts, and said center contact being accurately positioned with respect to and positioned to make said electrical connection with said center lead when said device is thus steered, said contactor assembly being driven repeatedly through a closed-loop path of motion that incudes a testing path portion where said contacts are lowered onto said leads and drawn along said leads as an electrical test is performed, wherein the improvement comprises means for combing said radial leads and maintaining a separation between them during said testing, said combing and separation means including at least one blade means formed of a resilient insulating material and associated with each said center contact, means for mounting said blade means to interpose itself between two adjacent ones of said leads during said testing path portion, and means for precisely locating said blade means with respect to said associated center contact to insure that said blade means locates the spacings between said leads as said contactor assembly is lowered and drawn along said leads.

2. The combing and separation means of claim 1 wherein said precision locating means comprises a window in said center contact located near said associated end portion; and a fixed locating member that projects into said window, each of said comb blades and said mounting means being in a face-abutting relationship with an associated one of said locating members to provide said precise locating.

3. The combing and seperation means of claim 1 wherein said locating member comprises a pin that spans said window in a direction generally aligned with the longitudinal axis of the associated contact.

4. The combing and separation means of claim 3 wherein said comb blade means is formed of a material exhibiting a low co-efficient of sliding function and a high degree of wear resistance.

* * * * *